(12) United States Patent
Schultz (10) Patent No.: US 12,449,381 B2
(45) Date of Patent: Oct. 21, 2025

(54) MICROWAVE DIELECTRIC ANALYZER (71) Applicant: COMPASS TECHNOLOGY GROUP, LLC, Alpharetta, GA (US)

(72) Inventor: John Weber Schultz, Alpharetta, GA (US)

(73) Assignee: COMPASS TECHNOLOGY GROUP LLC, Alpharetta, GA (US)

( * ) Notice: Subject to any disclaimer, the term of this patent is extended or adjusted under 35 U.S.C. 154(b) by 288 days.

(21) Appl. No.: 17/961,962

(22) Filed: Oct. 7, 2022

(65) Prior Publication Data
US 2023/0036023 A1 Feb. 2, 2023

Related U.S. Application Data

(62) Division of application No. 16/515,813, filed on Jul. 18, 2019, now Pat. No. 11,467,102.

(60) Provisional application No. 62/699,910, filed on Jul. 18, 2018.

(51) Int. Cl.
*G01N 22/00* (2006.01)
*H05K 1/02* (2006.01)

(52) U.S. Cl.
CPC ............ *G01N 22/00* (2013.01); *H05K 1/0231* (2013.01); *H05K 1/024* (2013.01)

(58) Field of Classification Search
CPC ....... G01N 22/00; H05K 1/0231; H05K 1/024
USPC ..................................................... 324/750.26
See application file for complete search history.

(56) References Cited

U.S. PATENT DOCUMENTS

| | | | |
|---|---|---|---|
| 5,309,110 A | 5/1994 | O'Neill | |
| 5,659,972 A | 8/1997 | Min | |
| 6,472,885 B1 | 10/2002 | Green | |
| 7,777,500 B2 | 8/2010 | Kim | |
| 7,973,539 B1 | 7/2011 | Kim | |
| 2001/0050603 A1* | 12/2001 | Bergstedt | H05K 1/036 333/246 |
| 2003/0090276 A1* | 5/2003 | Weide | G01N 22/00 324/663 |
| 2003/0216244 A1* | 11/2003 | Kim | C04B 35/495 501/135 |
| 2007/0132460 A1* | 6/2007 | Tanbakuchi | G01N 22/00 324/636 |
| 2013/0028586 A1 | 1/2013 | Kagaya | |
| 2015/0077138 A1 | 3/2015 | Ghaser | |
| 2016/0169726 A1 | 6/2016 | Xie | |

(Continued)

*Primary Examiner* — Raul J Rios Russo
(74) *Attorney, Agent, or Firm* — Thomas | Horstemeyer, LLP (57) ABSTRACT

Various examples related to microwave dielectric analyzers and their use are provided. In one example, a microwave dielectric analyzer includes a measurement apparatus having a conductive electrode that can couple to a microwave analyzer and processing circuitry that can determine a dielectric characteristic of the dielectric specimen using a reflection coefficient measured by the microwave analyzer. The dielectric characteristic can be determined using a computational electromagnetic model of the measurement apparatus. The reflection coefficient can be measured by the microwave analyzer with the dielectric specimen in contact with the conductive electrode and/or sandwiched between conductive electrodes. The conductive electrodes can be axially aligned, and the second electrode may not be coupled to the microwave analyzer.

20 Claims, 7 Drawing Sheets

(56) References Cited

U.S. PATENT DOCUMENTS

2016/0352314 A1* 12/2016 Newman ............... C04B 35/495
2020/0121217 A1* 4/2020 Cargol .................. G01N 27/02

* cited by examiner

MICROWAVE DIELECTRIC ANALYZER

CROSS REFERENCE TO RELATED APPLICATIONS

This application is a divisional application of U.S. non-provisional application entitled "Microwave Dielectric Analyzer" having Ser. No. 16/515,813, filed Jul. 18, 2019, which claims priority to, and the benefit of, U.S. provisional application entitled "Microwave Dielectric Analyzer" having Ser. No. 62/699,910, filed Jul. 18, 2018, both of which are hereby incorporated by reference in their entireties.

BACKGROUND

In many applications, material characterization is important to selecting and predicting design results. For example, printed circuit (PC) board characteristics can affect the operation of the circuit printed on the PC board. In some cases, materials surrounding a wireless antenna can affect the performance of that antenna. The characterization of dielectric properties of such sheet materials over a wide frequency range can be expensive and time consuming.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Disclosed herein are various aspects related to microwave dielectric analyzers, and methods thereof. The microwave dielectric analyzers can be designed for non-destructive characterization of dielectric specimens such as, e.g., printed circuit (PC) boards, antenna substrates, and antenna radomes/packaging. The microwave dielectric analyzers can measure flat specimens (e.g., up to 3 mm thick or larger), and determine dielectric characteristics of the specimen with measurements taken in a range from about (or below) 3 MHz to about 6 GHz, about 10 MHz to about 6 GHz, or more. Reference will now be made in detail to the description of the embodiments as illustrated in the drawings, wherein like reference numbers indicate like parts throughout the several views.

Figure 1A:
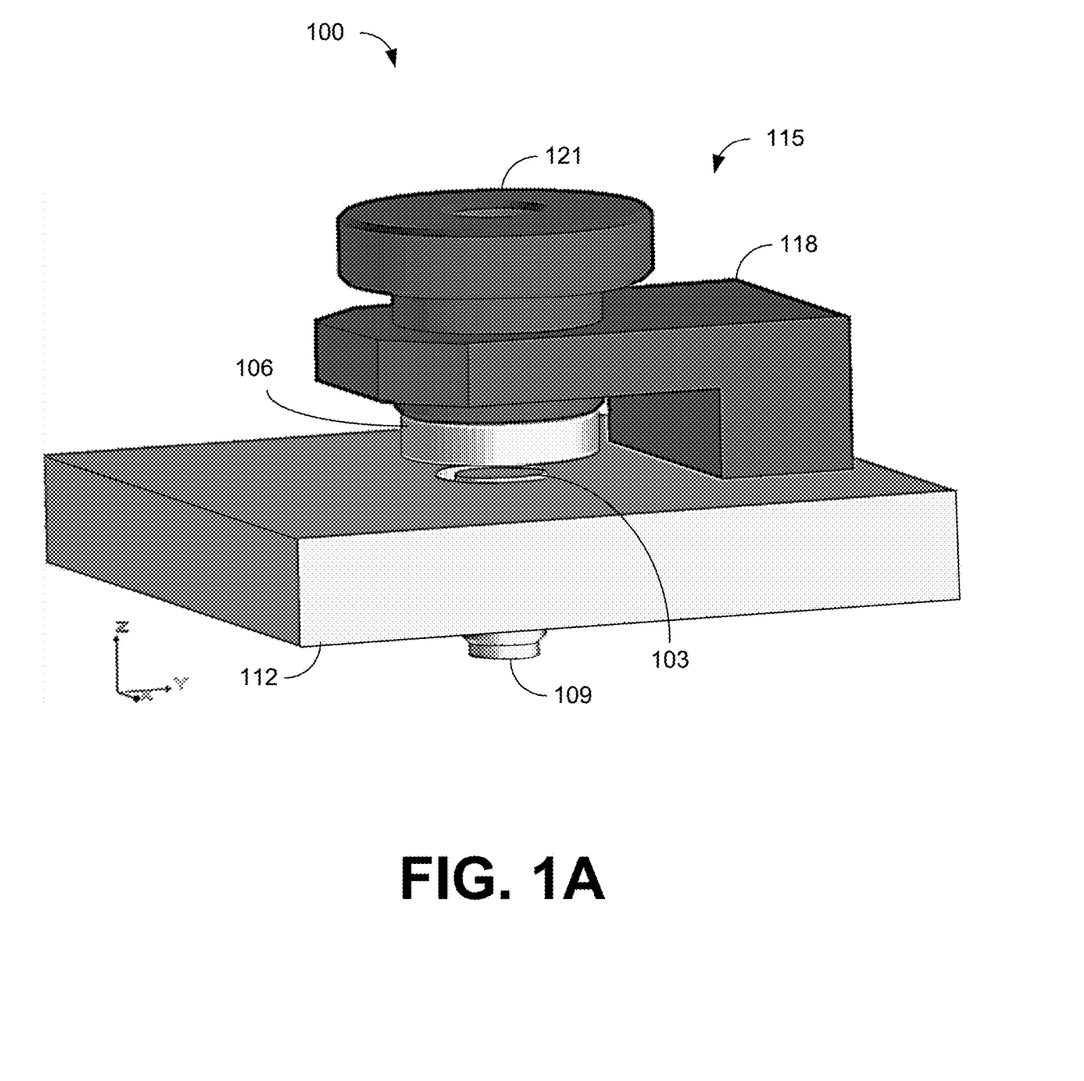
FIGS. 1A-1C illustrate an example of a measurement apparatus of a microwave dielectric analyzer, in accordance with various embodiments of the present disclosure.

Referring to FIG. 1A, shown is an example of a measurement apparatus (or fixture) 100 of a microwave dielectric analyzer. The measurement apparatus 100 can include a pair of parallel conductive electrodes for measuring dielectric specimens secured between the conductive electrodes. For example, a first (or bottom) conductive electrode 103 can be axially aligned with a second (or upper) conductive electrode 106, such that measurements can be obtained for a dielectric specimen sandwiched (or secured) between the conductive electrodes 103 and 106. The conductive electrodes 103 and 106 can be made of appropriate conductive materials (e.g., stainless steel, aluminum, etc.). One of the conductive electrodes is coupled to a microwave analyzer, while the other conductive electrode remains disconnected. A specimen under test can be inserted between the conductive electrodes 103 and 106. As shown in FIG. 1A, a radio frequency (RF) connector 109 (e.g., an N-type, SMA, or other connector) can be used to couple the first electrode 103 to the microwave analyzer.

The measurement apparatus (or fixture) 100 of the microwave dielectric analyzer can also include a metal base plate 112 surrounding the first electrode 103, which can provide shielding and structural support for the bottom electrode. The base plate 112 can be made of an appropriate conductive material (e.g., stainless steel, aluminum, etc.). In addition, the measurement apparatus 100 can include a non-conductive yoke 115 supporting the second conductive electrode 106 over the first conductive electrode 103. The yoke 115 can be made from plastic or other appropriate insulating material (e.g., polystyrene, PPO, polyethylene, acrylic, ultem, etc.). In the example of FIG. 1A, the yoke 115 includes a support arm 118 positioned on the base plate, and a handle 121 that is threaded through the support arm and can be turned to adjust the separation between the first and second conductive electrodes 103 and 106. By turning the handle 121, the second conductive electrode 106 can be screwed down onto the specimen being tested.

Figure 1B:
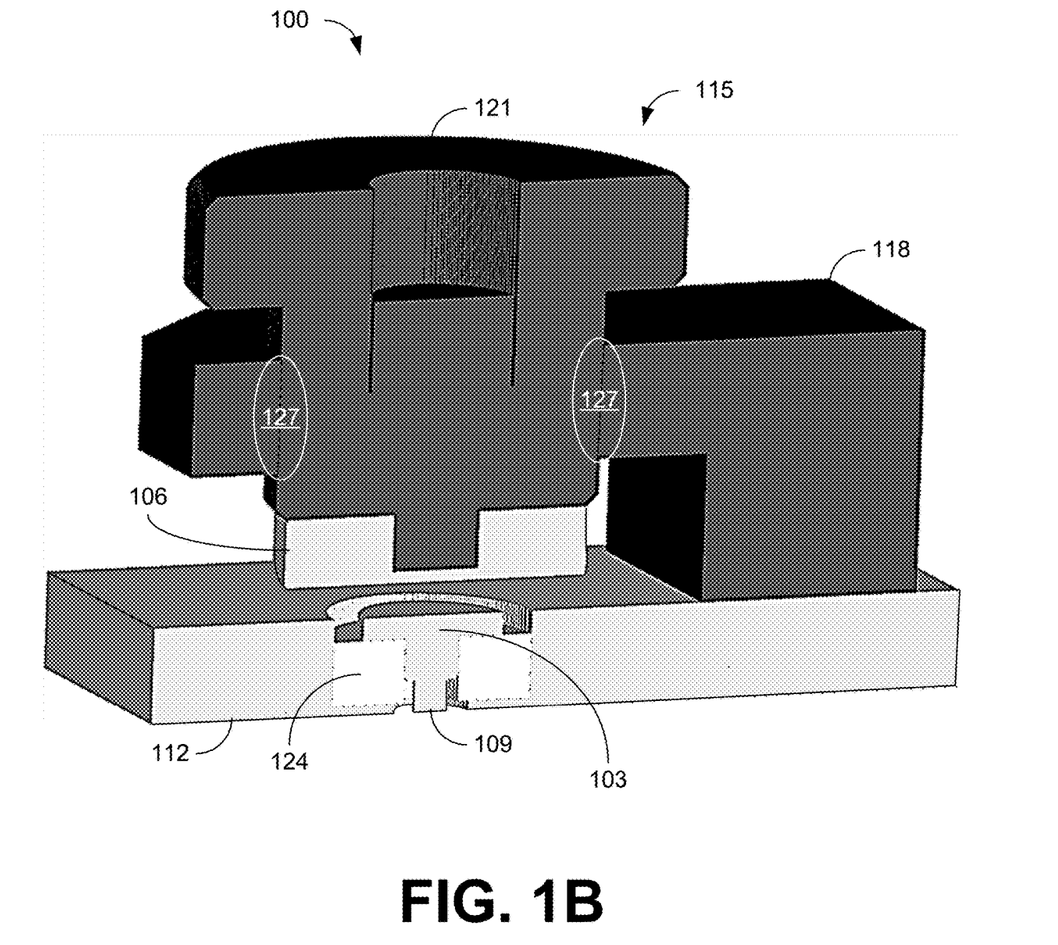

Referring next to FIG. 1B, shown is a cross-sectional view of the measurement apparatus (or fixture) 100 of FIG. 1A. As shown, the first conductive electrode 103 can be mounted in the metal base plate 112 using, e.g., a dielectric spacer 124 such as an insulator (e.g., polystyrene, PPO, acrylic, etc.) or other appropriate material with the RF connector 109 extending through the opposite side of the base plate 112. The second conductive electrode 106 can be attached to the handle 121 of the yoke 115 using a fastener such as a nylon screw of other appropriate fastener. In some embodiments, the second conductive electrode 106 can be integrated into the yoke 115 using other techniques. The yoke 115 is configured to allow the position of the second conductive electrode 106 to be adjusted. For example, the support arm 118 and handle 121 can be threaded 127 such that turning the handle 121 can adjust the position of the second conductive electrode 106. In this way, the second conductive electrode 106 can be lowered onto the specimen under test, sandwiching the specimen between the conductive electrodes 103 and 106.

FIG. 10 illustrates exemplary dimensions of the measurement apparatus (or fixture) 100 of FIGS. 1A and 1B. As can be seen, the diameter of the second conductive electrode is larger than the diameter of the first conductive electrode 103. The sizes of the electrodes can be set to maximize measurement sensitivity. Additionally, the maximum size of the bottom electrode can be set to prevent resonances in the apparatus response over the desired measurement frequency range. The diameter of the second conductive electrode 106 can overlap with a portion of the metal base plate 112. The larger second electrode size in this example also helps to reduce errors from electrode misalignment. In this configuration, the measurement apparatus 100 can be used to test specimens of various sizes. For example, a square specimen of about 12 inches by 12 inches and having a thickness of about (or just under) 0.125 inch or about 3 mm can be accommodated by the measurement apparatus 100. FIG. 2 is a graphical representation illustrating a specimen 203 sandwiched between the conductive electrodes 103 and 106. As can be seen, the second conductive electrode 106 extends beyond the first conductive electrode 103, and overlaps a portion of the base plate 112.

Figure 1C:
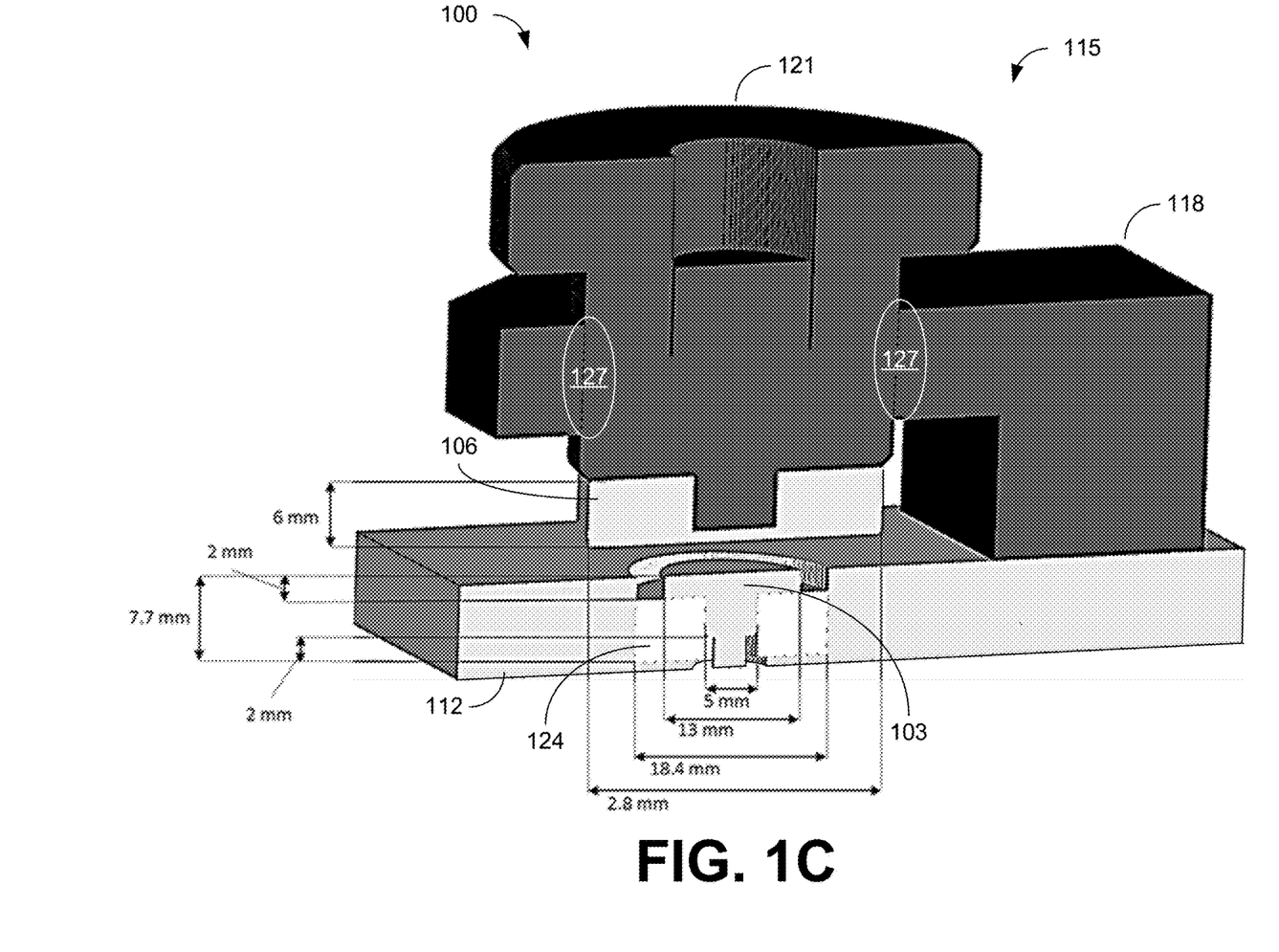
Figure 2:
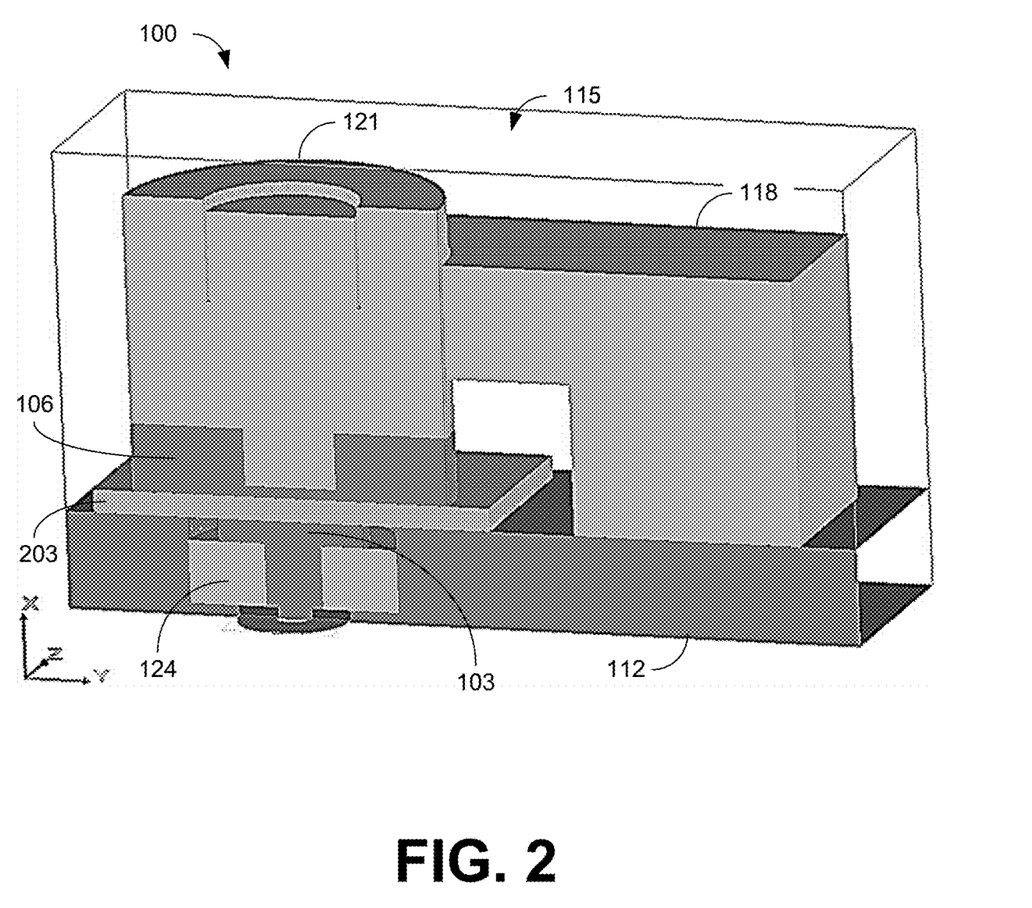
FIG. 2 is a graphical representation showing a specimen under test sandwiched between the conducting electrodes of the measurement apparatus, in accordance with various embodiments of the present disclosure.

In other embodiments, the measurement apparatus 100 includes only a single (or bottom) conductive electrode 103 without including the second conductive electrode as illustrated in FIGS. 1A-1C. In these implementations, the measurement apparatus 100 can also include a metal base plate 112 surrounding the single electrode 103, which can provide shielding for the single conductive electrode 103. The non-conductive yoke 115, without the second conductive electrode 106, can be used to secure the specimen under test in contact with the single conductive electrode 103. For example, the handle 121 can be turned to apply pressure to the specimen to hold it against the conductive electrode 103, and against a surface of the base plate 112. Other features of the measurement apparatus 100 can also be discussed above.

As previously mentioned, the microwave dielectric analyzer can be used to determine characteristics of flat dielectric specimens over a wide range of frequencies (e.g., about (or below) 3 MHz to about 6 GHz, about 10 MHz to about 6 GHz, etc.). The measurement apparatus 100 can be adjusted to test specimens having different thicknesses. For example, the yoke 115 of the measurement apparatus 100 can be configured to allow testing of planar specimens having a thickness of up to about 3 mm, up to about 0.125 inch, or more.

While suitable for non-destructive characterization a wide range of dielectric specimens, one application of the microwave dielectric analyzer is characterization of PC board specimens. For instance, a user can place the specimen over the first (or bottom) conductive electrode 103, and then adjust the yoke 115 to place the second (or upper) conductive electrode 106 on top of the specimen to make measurements using the microwave analyzer coupled to the first conductive electrode 103. The microwave dielectric analyzer can use a vector network analyzer (VNA), vector voltmeter, or similar microwave device to obtain the reflection coefficient (S11) measurements, which can then be converted to dielectric characteristics of the specimen (e.g., complex permittivity including both real and imaginary components) using the computational model of the measurement apparatus 100. The VNA is configured to interface with processing circuitry such as a computing device (e.g., a personal computer, laptop, notepad or smartphone) or other appropriate circuitry. Such a determination method is unique using the fixture of the measurement apparatus 100.

The measurement fixture 100 can be optimized using computational electromagnetic (CEM) codes, and dimensions of the first and/or second conductive electrodes 103/106 can be optimized for a desired frequency range, e.g., up to 6 GHz. FIG. 10 provides an example of dimensions and alignment of the conductive electrode 103 and 106 for a range from about 3 MHz to about 6 GHz, or about 10 MHz to about 6 GHz. The first (or bottom) conductive electrode 103 does not have chamfers, but the second (or upper) conductive electrode 106 may have small chamfers. Dimensions of the yoke 115, which serves to aid in electrode positioning, can vary since the support arm 118 and handle 121 are both made of non-conducting materials. No metal screws or other fasteners are above the base plate 112, as they may cause small resonances in response that increase the measurement uncertainty. Simulations have shown that a 2 mm gap between the coax feed 109 and the first (or bottom) conductive electrode 103 works well for preserving the impedance match for an N-type connector with air as the spacer. Other gap and electrode dimensions may work better for other types of microwave connectors.

The measured reflection coefficient S11 can be correlated with dielectric properties of the specimen being tested. The computational model may be constructed using a conventional electromagnetic code, such as FEM (finite element method) or FDTD (finite difference time domain). The dielectric properties can be determined based upon a computational model. The computational model can be used to create a pre-calculated look-up table, which can be searched to identify the dielectric properties from the measured reflection coefficient of the measurement (or fixture) apparatus 100. A series of full-wave simulations can be run for different combinations of sample dielectric permittivity, dielectric loss, and thickness. This data can then be used to form the basis for translating the measured reflectivity (phase and amplitude) into complex permittivity. Interpolation can be used in the inversion to obtain high fidelity results from a courser database of simulated results.

Figure 3:
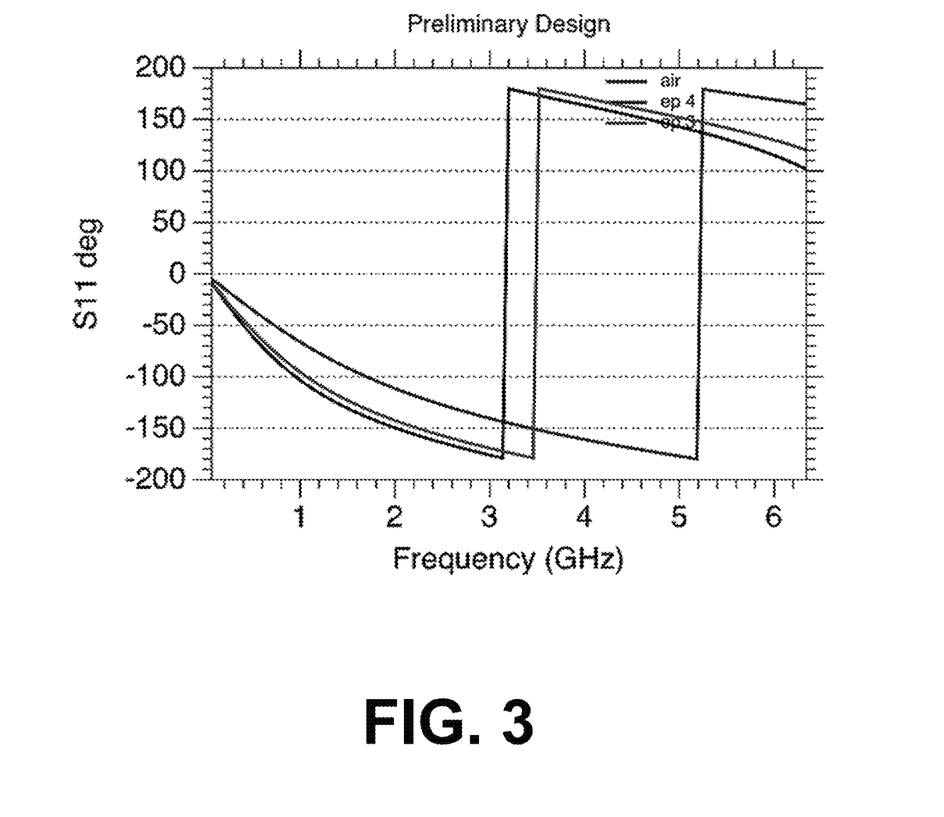
FIG. 3 is a plot illustrating examples of computationally modeled phase of a reflection coefficient S11 for various dielectric specimens in a dielectric analyzer apparatus, in accordance with various embodiments of the present disclosure.

Referring to FIG. 3, shown is a plot illustrating the computationally modeled phase of the S11 over a frequency range from about 1 MHz to 6 GHz. FIG. 3 shows the computationally modeled phase of the S11 from the measurement assembly 100 as a function of three different dielectric specimens. Computationally modeled amplitudes are also determined for the different dielectric specimens. The computationally modeled phase and amplitude can be used to determine the dielectric characteristics based upon the measured reflection coefficient.

Figure 4A:
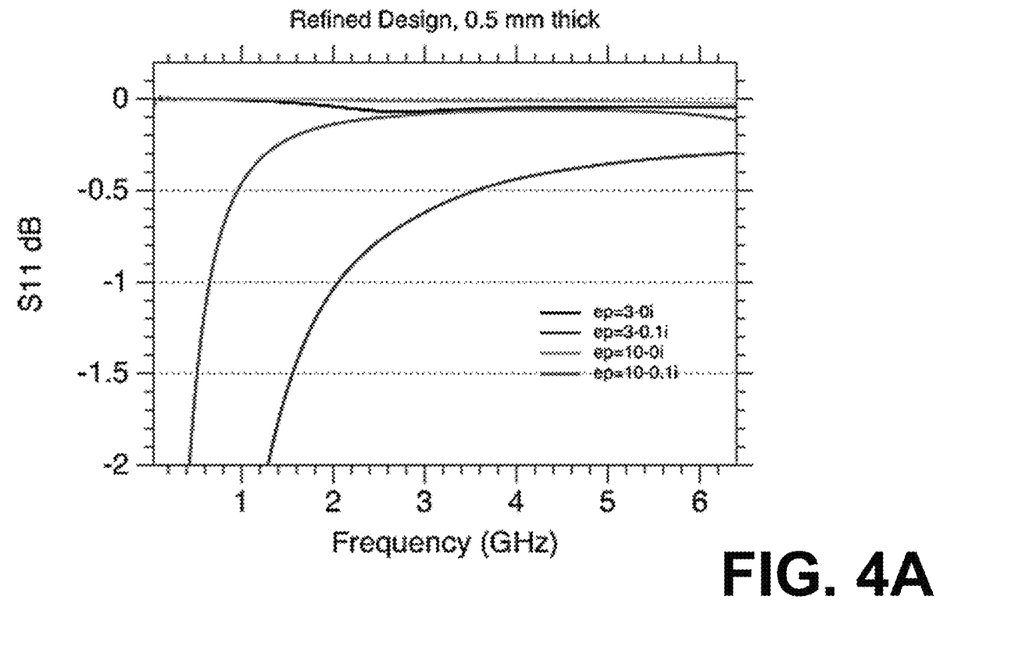
FIGS. 4A and 4B are plots illustrating examples of computationally modeled phase and amplitude for low and moderate loss specimens with a thickness of 0.5 mm inserted into a dielectric analyzer apparatus, in accordance with various embodiments of the present disclosure.
Figure 4B:
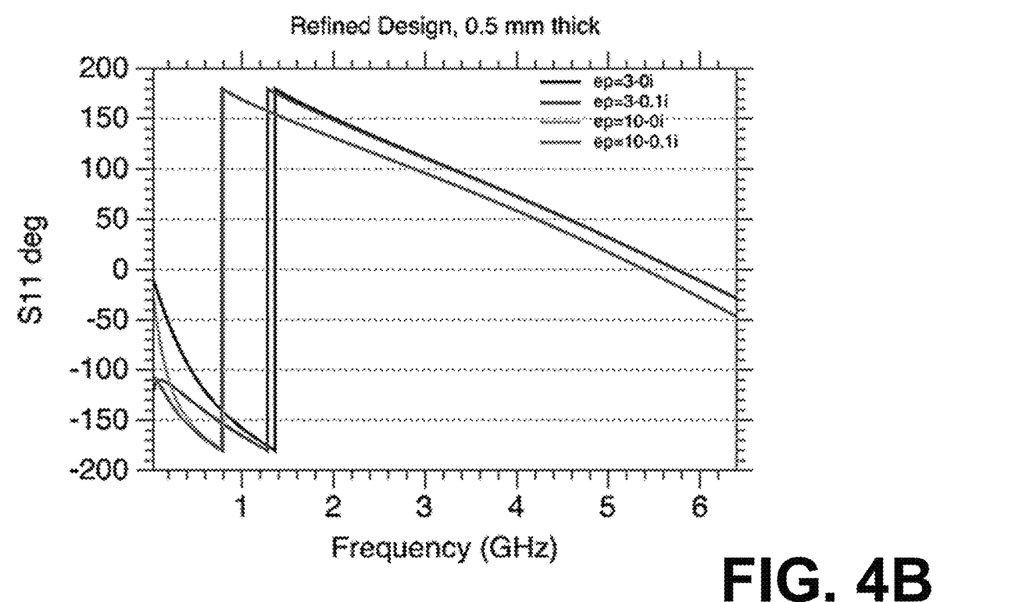
Figure 5A:
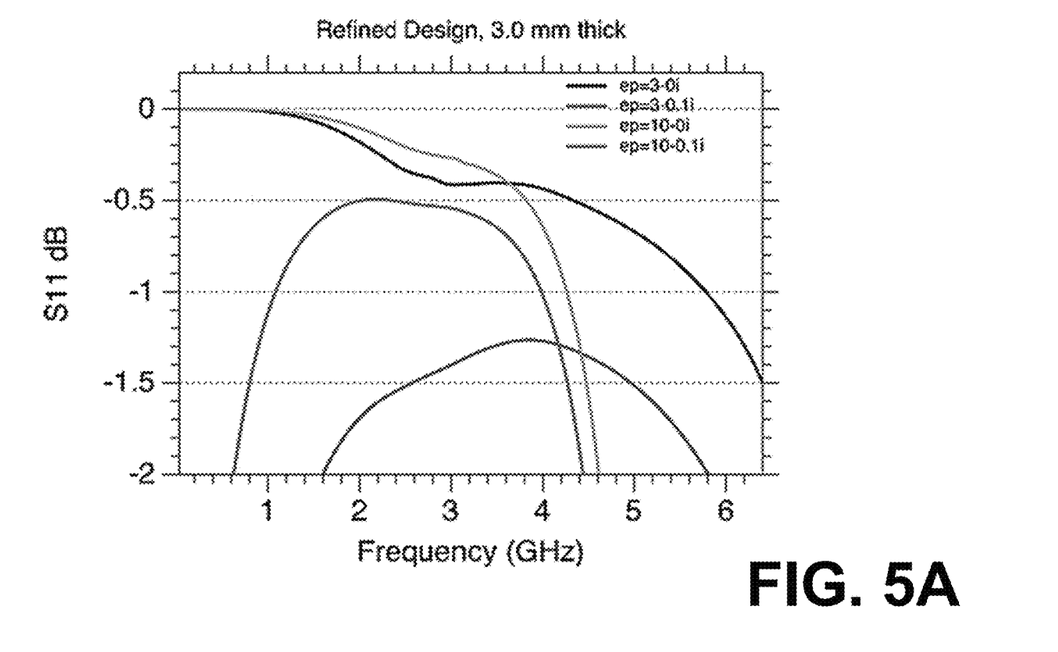
FIGS. 5A and 5B are plots illustrating examples of computationally modeled phase and amplitude for low and moderate loss specimens with a thickness of 3.0 mm inserted into a dielectric analyzer apparatus, in accordance with various embodiments of the present disclosure.
Figure 5B:
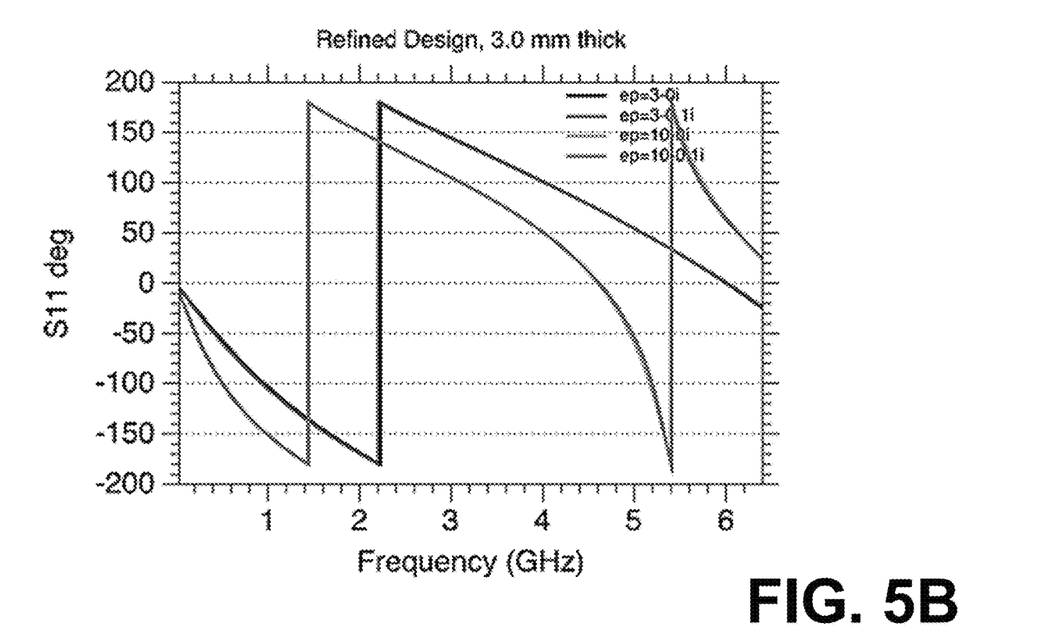

FIGS. 4A and 4B show examples of computationally modeled S11 for various low and moderate loss specimens having a thickness of 0.5 mm. FIG. 4A shows the amplitude over a frequency range of about 1 MHz to about 6 GHz, and FIG. 4B shows the phase over the same frequency range. FIGS. 5A and 5B show examples of computationally modeled S11 for the low and moderate loss specimens having a thickness of 3.0 mm, with FIG. 5A showing the amplitude and FIG. 5B showing the phase over the frequency range. A database of these responses can be used to determine the complex permittivity (or other dielectric characteristics) from the S11 measured using the measurement apparatus 100. Backwards calculations can be used to identify the dielectric properties of the specimen under test.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The term "substantially" is meant to permit deviations from the descriptive term that don't negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A microwave dielectric analyzer, comprising:
a measurement apparatus having a single conductive electrode configured to couple to a microwave analyzer; and
processing circuitry configured to determine a dielectric characteristic of a dielectric specimen based upon a reflection coefficient measured by the microwave analyzer with the dielectric specimen in contact with the single conductive electrode, the dielectric characteristic determined based upon a computational electromagnetic model of the measurement apparatus.

2. The microwave dielectric analyzer of claim 1, wherein the dielectric characteristic is permittivity, loss or conductivity of the dielectric specimen.

3. The microwave dielectric analyzer of claim 1, wherein the dielectric characteristic is determined from a look-up table determined using the computational electromagnetic model of the measurement apparatus.

4. The microwave dielectric analyzer of claim 3, wherein the dielectric characteristic is determined by interpolating the look-up table.

5. The microwave dielectric analyzer of claim 1, wherein the measurement apparatus comprises a metal base plate surrounding the single conductive electrode.

6. The microwave dielectric analyzer of claim 5, wherein the measurement apparatus comprises an insulating yoke configured to secure the dielectric specimen in contact with the single conductive electrode.

7. The microwave dielectric analyzer of claim 6, wherein the dielectric specimen is in contact with the metal base plate when in contact with the single conductive electrode.

8. The microwave dielectric analyzer of claim 1, wherein the dielectric characteristic of the dielectric specimen is determined for frequencies above 1 GHz.

9. The microwave dielectric analyzer of claim 1, wherein the measurement apparatus is calibrated with a single calibration measurement of a known calibration specimen, without the need for additional calibration measurements.

10. A microwave dielectric analyzer, comprising:
a single conductive electrode configured to couple to a microwave analyzer; and
processing circuitry configured to determine a dielectric characteristic of a dielectric specimen based upon a reflection coefficient measured by the microwave analyzer with the dielectric specimen sandwiched between the single conductive electrode and a non-conductive contact, the dielectric characteristic determined based upon a computational electromagnetic model of the measurement apparatus.

11. The microwave dielectric analyzer of claim 10, wherein the dielectric characteristic is permittivity, loss or conductivity of the dielectric specimen.

12. The microwave dielectric analyzer of claim 10, wherein the dielectric characteristic is determined from a look-up table determined using the computational electromagnetic model of the measurement apparatus.

13. The microwave dielectric analyzer of claim 12, wherein the dielectric characteristic is determined by interpolating the look-up table.

14. The microwave dielectric analyzer of claim 10, wherein the dielectric characteristic of the dielectric specimen is determined for frequencies above 1 GHz.

15. The microwave dielectric analyzer of claim 10, wherein the measurement apparatus is calibrated with a single calibration measurement of a known calibration specimen, without the need for additional calibration measurements.

16. The microwave dielectric analyzer of claim 15, wherein the single calibration measurement is taken after measurement of the dielectric specimen.

17. The microwave dielectric analyzer of claim 10, wherein an insulating yoke comprises the non-conductive contact.

18. The microwave dielectric analyzer of claim 17, wherein a position of the insulating yoke is adjustable to sandwich the dielectric specimen between the single conductive electrode and the non-conductive contact.

19. The microwave dielectric analyzer of claim 18, wherein the insulating yoke is configured to axially adjust its position with respect to the single conductive electrode to sandwich the dielectric specimen between the single conductive electrode and the non-conductive contact.

20. The microwave dielectric analyzer of claim 10, wherein the measurement apparatus comprises a metal base plate surrounding the single conductive electrode.

* * * * *